Jan. 15, 1957 J. J. ZIMMERMAN 2,777,477

CUTTING AND FORMING MECHANISM

Filed Jan. 23, 1953 4 Sheets-Sheet 1

INVENTOR.
Jack J. Zimmerman
BY
Foorman L. Mueller
Atty.

INVENTOR.
Jack J. Zimmerman
BY
Norman L. Mueller
Att'y

INVENTOR.
Jack J. Zimmerman
BY
Norman L. Mueller
Atty.

INVENTOR.
Jack J. Zimmerman
BY
Foorman L. Mueller
Att'y 2,777,477

CUTTING AND FORMING MECHANISM

Jack J. Zimmerman, Riverside, Ill., assignor to Motorola, Inc., Chicago, Ill., a corporation of Illinois Application January 23, 1953, Serial No. 332,875

5 Claims. (Cl. 140—71)

This invention relates to a mechanism for cutting the contact wires of electrical components, such as fixed resistors or capacitors, to a desired length and for forming such contact wires into a desired configuration so that the components may be conveniently and efficiently mounted on the chassis of a radio or television receiver or the like.

The basic manufacturing techniques of radio and television receiver chassis have remained the same for many years. The usual procedure for each unit is to assemble and secure various components such as coils, transformers, tube sockets, and the like to a suitably perforated and formed chassis. Thereafter, other smaller components such as fixed resistors and capacitors which may be supported and secured by their contact wire or pig-tail connections are connected to various terminals of the chassis, transformers, and sockets or the like by cutting and crimping the pig-tail connections to their respective terminal points. Wires for interconnecting various terminals and socket connections are also cut to length and secured by crimping. In order to provide uniformly good electrical conductive joints at the various crimped wire ends, a soldered connection is formed by applying fluxed solder and transferring sufficient heat with a hand-manipulated soldering iron or the like to effect a solder bond between the wires and terminals. Needless to say, a large amount of skilled manual labor is involved in cutting, crimping and soldering the many connections of a radio or television receiver.

In recent years printed circuit techniques have been developed in an effort to reduce the amount of manual labor involved in assembling and wiring a radio receiver. The conventional printed circuit procedure is to apply by suitable printing or coating processes a variegated design of conductive material on an insulated base. The conductive material thus formed on the insulated base establishes the electrical connection between various electrical components that are to be secured thereon and therefore eliminates the wire connections previously used. Nevertheless, it is still necessary to connect additional electrical components such as fixed capacitors and resistors to the printed circuit on the insulated chassis and such connections are electrically bonded by soldering.

Copending application Serial No. 292,424 filed June 9, 1952, in the name of Jack J. Zimmerman and assigned to the present assignee, discloses and claims a mechanism by means of which the various components of a radio or television receiver may be automatically soldered in an improved fashion into the receiver circuit and onto the printed insulated base described above. This mechanism is such that a large number of such bases may successively have fixed resistors and capacitors and the like soldered thereto in a rapid and efficient fashion. When such a machine is used, it is necessary that the electrical components such as fixed capacitors and resistors which are to be soldered into the receiver circuit previously have their contact wires cut to a selected length and bent over so that the ends of the contact wires may be inserted into holes in the insulated base prior to the automatic soldering operation. The present invention provides a mechanism for quickly and efficiently cutting and shaping the wires of such fixed capacitors, resistors, and other components to the desired configuration to render them suitable for use in conjunction with the automatic soldering machine referred to above.

It is, accordingly, an object of this invention to provide an improved mechanism for rapidly and efficiently cutting and forming the contact wires of certain electrical components to facilitate the incorporation of such components into a radio or television receiver or the like.

A more specific object of the invention is to provide such an improved mechanism for cutting and forming the contact wires of certain electrical components to enable such components conveniently to be mounted and connected into the imprinted insulated base or chassis of a radio or television receiver, or the like, by means of an automatic soldering process.

A feature of the invention is the provision of a mechanism which not only cuts the contact wires of an electrical component such as a fixed resistor or capacitor to a desired length, but also forms the cut wires into a desired configuration for the reasons mentioned previously herein.

The above and other features of the invention which are believed to be new are set forth with particularity in the appended claims. The invention itself, however, together with further objects and advantages thereof may best be understood by reference to the following description when taken in conjunction with the accompanying drawings in which:

Fig. 1 shows an end-view of the improved cutting and forming mechanism of the invention, Fig. 2 shows a top view of a portion of the mechanism to illustrate the cutting and forming operation thereof, Fig. 3 shows a top view of the entire mechanism of the invention, Fig. 4 is a view taken along the lines 4—4 of Fig. 3, Fig. 5 is a sectional view taken along the lines 5—5 of Fig. 3, Fig. 6 shows an electrical component whose contact wires have been cut and formed by the mechanism of the present invention.

Figure 1:
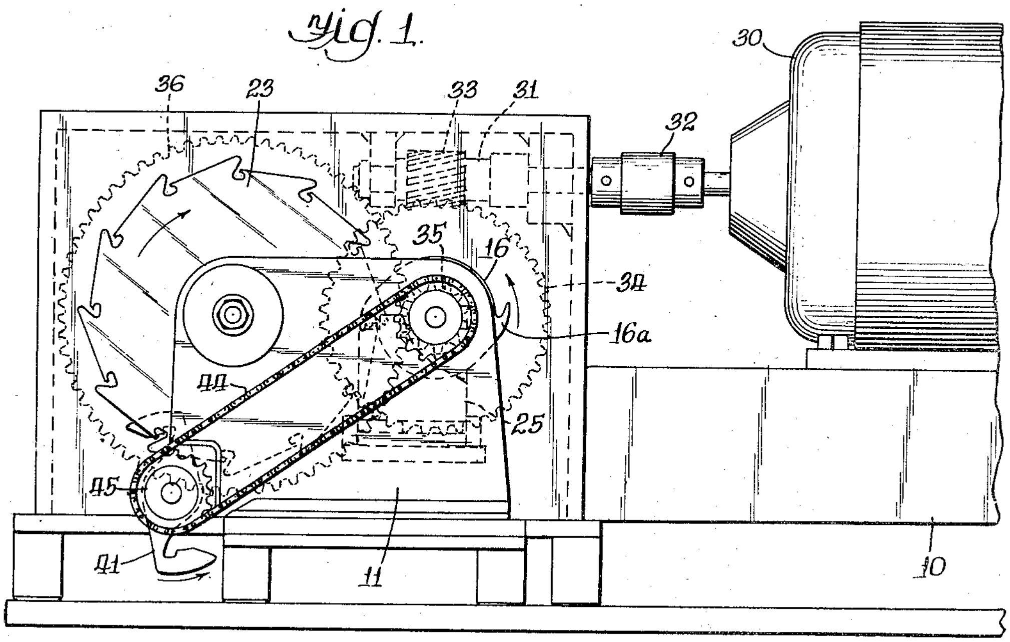

As previously mentioned, the purpose of the mechanism of this invention is to cut off the excess length of each of the pair of contact wires or pig-tails extending from the ends of an electrical component, such as a fixed resistor or capacitor, and for forming the cut wires into a desired bent-over configuration. The mechanism includes a rotatable carriage for supporting a series of components of the above mentioned type about its periphery with the contact wires of such components extending axially beyond the sides of the carriage. A pair of forming and cutting members are respectively disposed with their inner sides contiguous to an arcuate portion of the side of the carriage, and a pair of rotary members are respectively disposed with their inner sides contiguous to the outer side of the forming and cutting members. Each rotary member has at least one arm in shearing relation with an outer edge of the forming members. The side of each of the cutting and forming members facing the rotatable carriage has a horizontal shoulder, and this shoulder is also tapered inwardly to form a knife edge at the outer side thereof. As the carriage rotates, the protruding contact wires lie across the above mentioned shoulder of each of the forming and cutting members and the portion of each wire extending beyond the outer side of the corresponding cutting and forming member is sheared off by the arm of the corresponding rotary member. Continued rotation of the carriage causes the forming members to bend the remaining protruding portions of the contact wires inwardly against the sides of the carriage, completing the forming process and causing the contact wires of the supported components to have the desired configuration.

Referring now to the drawings, the cutting and forming mechanism of the invention is supported on a base 10 which has a bracket 11 and a housing 12 secured to opposite ends thereof. A pair of shafts 13 and 14 are rotatably supported in suitable bearings between the housing and bracket in spaced parallel relation one with the other. Shaft 13 supports a pair of rotary members 15, 16 which are mounted thereon by means of set screws 17, 18 respectively and may be moved axially along shaft 13 to any desired position merely by loosening the set screws. Shaft 14 has a rotatable carriage 19 mounted thereon which supports in spaced relation about its periphery the electrical components whose contact wires are to be cut and formed, the components being supported with their contact wires extending axially beyond the sides of the carriage, as shown. Carriage 19 comprises a first pair of locating discs 20, 21 which are mounted on shaft 14 by means of appropriate set screws and are adjustable axially along the shaft to a desired position between rotary members 15, 16. Discs 20 and 21 are spaced apart an amount corresponding to the length of the body portion of the electrical components to be treated in the machine, and each disc has a series of peripheral notches or gullets for supporting the contact wires of each component adjacent the end of its body portion. Carriage 19 further comprises a second pair of locating discs 22, 23 which are respectively spaced from the outer sides of the first mentioned discs, and which are mounted on shaft 14 by means of appropriate set screws. Discs 22 and 23 are, likewise, adjustable axially along the shaft and are set at a position corresponding to the point at which each contact wire of each component is to be formed. Locating discs 22 and 23 also have peripheral notches or gullets aligned with the gullets in discs 20 and 21 and which also support the contact wires of the electrical components.

Figures 3, 4:
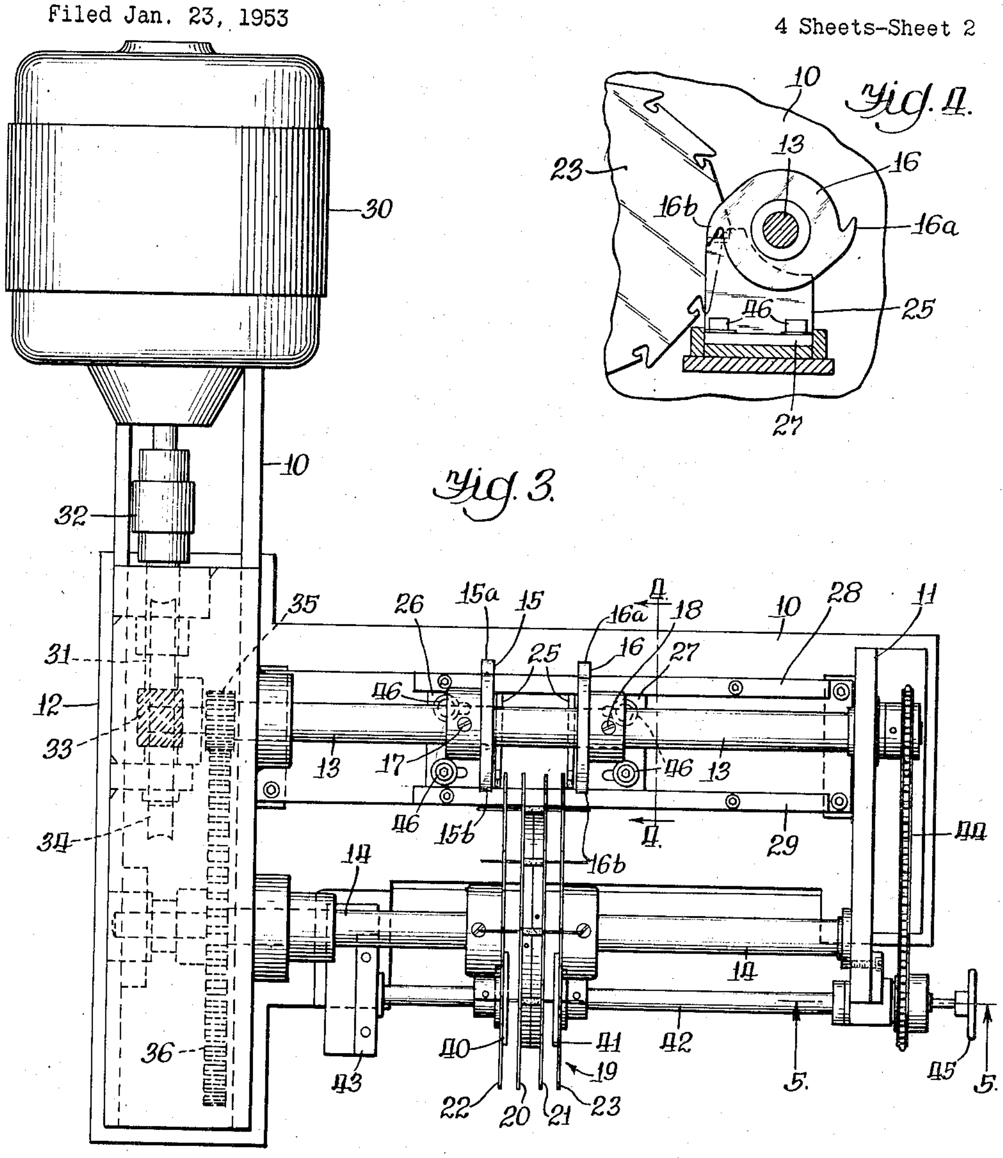

The mechanism also includes a pair of cutting and forming members respectively having upstanding flat rectangular-shaped portions 24, 25 and respectively having bent-over bottom portions 26 and 27. The portions 26 and 27 of the cutting and forming members are supported in tracks 28, 29 on base 10 and may be moved along the tracks in a direction parallel to the axis of rotation on carriage 19. The upstanding portions of the forming members are disposed in planes parallel to the planes of the sides of locating discs 22 and 23 and are positioned with their inner sides contiguous to an arcuate portion of the outer sides of the last-mentioned locating discs and held in this position by screws 46 extending through slots in portions 26 and 27. As best shown in Fig. 4, the edge of each of the portions 24 and 25 facing carriage 19 is formed with a horizontal shoulder so that the projecting contact wires of the supported components rest directly across the shoulders as carriage 19 rotates. Moreover, the shoulders are tapered inwardly to form a knife edge at each of their outer sides. The cutting and forming members are disposed contiguous the outer surface of discs 22 and 23, as previously mentioned, and spaced therefrom a small distance corresponding to the diameter of the contact wires of the electrical components supported by carriage 19. Rotary members 15 and 16 are disposed with their inner side contiguous to the outer side of the respective forming members, and each rotary member has a pair of arms **15*a*, 15*b*, and 16*a*, 16*b*** in respective shearing relation with the above-mentioned knife edge on the corner of each of the forming members.

An electric motor 30 is supported by base 10 adjacent housing 12 and along an axis perpendicular to the axis of shafts 13 and 14. Motor 30 is coupled to a drive shaft 31 through a coupler 32, the drive shaft having a worm 33 mounted thereon which engages a pinion 34 secured to shaft 13 so that the latter shaft may be rotated. A pinion 35 is also secured to shaft 13 and drives a gear 36, the latter gear being mounted on shaft 14 so that the latter shaft may be rotated at a slower rate of speed than shaft 13 for reasons to be noted hereinafter.

Figure 2:
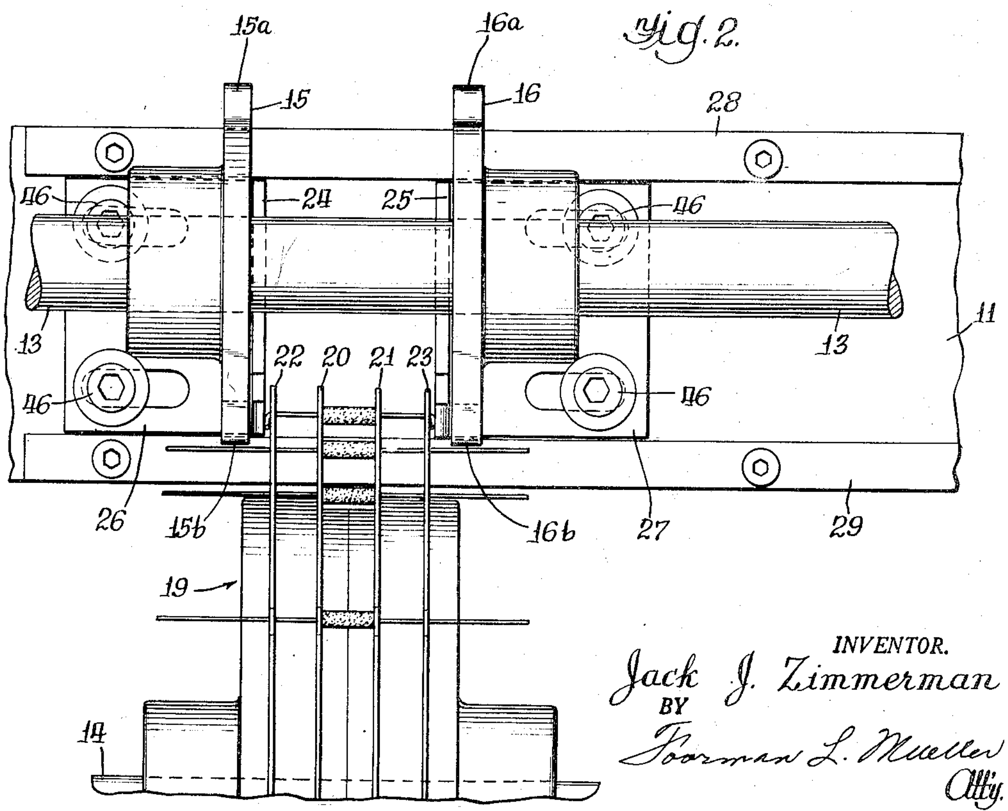

As carriage 19 rotates, an operator places the electrical components whose contact wires are to be cut and formed by the machine into the various gullets in locating discs 20—23 in the positions shown in Figs. 2 and 3 with the contact wires of such components extending beyond the sides of the carriage. The rotation of carriage 19 is such that, as viewed in Fig. 2, the electrical components placed in the locating discs are carried upwardly towards the cutting and forming members 24, 25 and rotary members 15, 16. Locating discs 20, 21 are previously adjusted axially on shaft 14 so that their spacing corresponds to the length of the body portion of the components to be supported, and locating discs 22 and 23 are also adjusted axially on shaft 14 so that they are positioned at points at which the contact wires of the supported components are to be formed. The gullets of all the discs have the configuration of the gullets of disc 23 shown in Fig. 1, and as the locating discs rotate towards the forming members the components drop to the lower point therein so as to be retained on the locating discs as carriage 19 rotates.

Figure 6:
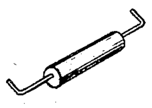

Rotation of carriage 19 causes the protruding portions of the contact wires of the supported electrical components successively to engage the aforementioned shoulders of the cutting and forming members 24 and 25. Rotary members 15 and 16 rotate in the opposite direction to carriage 19 and at the precise moment of each such engagement of the contact wires with the shoulders, one of the arms of each of the rotary members strikes the protruding portions of the contact wires and, in conjunction with the aforementioned knife edge of the shoulders, shears the contact wires at a point corresponding to the outer edge of each shoulder. As previously noted, the shoulders are tapered inwardly and, immediately after the shearing action, the continued rotation of carriage 19 draws the electrical components down through the forming members causing the protruding portions of the sheared contact wires to be bent over, as shown in Fig. 2. In this fashion, the contact wires of each of the supported components are cut and formed in the manner shown in Fig. 6, so that the contact wires have the desired configuration for insertion into a radio or television chassis.

Since the locating discs 20—23, the cutting and forming members 24 and 25, and rotary members 15 and 16, are all adjustable axially, the mechanism is extremely flexible and may be used to cut and form the contact wires of electrical components of a wide variety of body lengths, and perform the forming at any desired point along the extended contact wires of such components. It is apparent that the contact wires of each component may be cut and formed so as to have the same length and configuration or, when so desired, they may be acted upon by the mechanism to have unequal lengths and to be bent at different points. Under some circumstances, it is desirable that the contact wires of the electrical components be bent at points directly adjacent the body portion thereof and, when this is required, locating discs 22 and 23, or discs 20 and 21, are removed and the cutting and forming members 24 and 25 are adjusted to be adjacent to the remaining discs and the rotary members 15 and 16 are likewise adjusted to their proper positions adjacent members 24 and 25.

An ejector device is provided in the mechanism to facilitate the removal of the electrical components from carriage 19 after the contact wires of such components have been cut and formed by the machine. The ejector device comprises a pair of members 40, 41 mounted on a shaft 42 and respectively positioned adjacent an arcuate portion of the inside surface of locating discs 22 and 23. When only a single pair of locator discs is used, the ejector comprises a single member of the same configuration as members 40, 41 but disposed centrally between the locator discs. Shaft 42 is rotatably mounted between bracket 11 and bearing 43 on base 10, and is driven by shaft 13 by means of a chain drive 44. Each of the ejector members have the configuration of ejector 41 shown in Fig. 1, and, like rotary member 16, rotate in a counter-clockwise direction whereas the locating discs rotate in a clockwise direction as viewed in Fig. 1. The configuration of members 40 and 41 is such that, as the locating discs 22 and 23 of carriage 19 rotate in one direction, rotation of members 40 and 41 in the opposite direction lifts the supported electrical components out of the gullets and ejects them into an appropriate receptacle. As seen in Fig. 1, the ejector removes the formed components at a point substantially underneath the locator discs of carriage 19. The operator may conveniently, therefore, place components successively in the gullets as they rise towards him to the left of that figure.

Should, for example, carriage 19 have 12 sets of gullets on its various locating discs, a ratio speed between the carriage and the rotary and ejector members is of the order of 6:1 in order that the contact wires of components in successive gullets may be shaped, formed, and ejected. This obtains since each of the rotary members 15 and 16 has a pair of oppositely disposed shearing arms and each of the ejecting members 40 and 41 has a pair of oppositely disposed ejecting arms.

Figure 5:
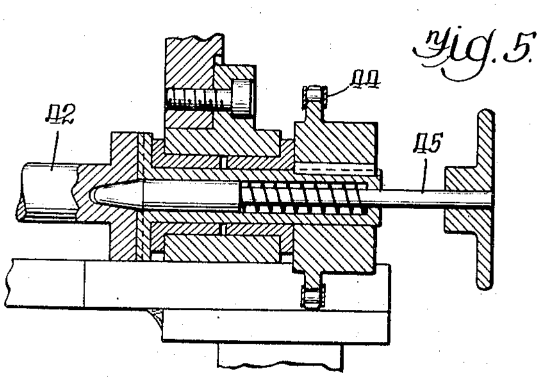

To facilitate adjustment of the mechanism, it is desirable that shaft 42 be removable. This is effectuated by providing a spring loaded pin 45 extending into the right hand end of the shaft through bracket 11. The engagement of pin 45 with shaft 42 is shown in Fig. 5, and it can be seen that merely by drawing the pin to the right of the drawing against the compression of its retaining spring and disassembling bearing 43, shaft 42 may be released for removal in a transverse direction from the machine. A like arrangement may be utilized in conjunction with shaft 14 to facilitate adjustment of the locating discs and removal thereof when so desired. Alternately, shaft 14 may be splined at its end extending into housing 12 so as to be removable by sliding it to the right of Fig. 3.

To facilitate in the insertion of the electrical components into the mechanism, the magazine structure of Figs. 7–10 is provided. The structure includes a supporting bracket 50 which is mounted on housing 10 and secured thereto by means of screws 51. The supporting bracket 50 has a pair of cylindrical sockets 52 and 53 formed integrally therewith and disposed one above the other. The sockets are adapted removably to receive a pair of plugs 54 and 55 which are formed integrally with a further bracket 56. A removable pin 57 is provided which extends across socket 53 and through plug 55 to prevent rotation of bracket 56. Bracket 56 extends outwardly from housing 10 in a plane parallel to the plane of discs 20—23 and has a further bracket 57 secured thereto by screws 58 and extending at right angles to a position in front of discs 20 and 21.

Bracket 57 supports a pair of plates 59 and 60 in spaced parallel relation therewith, the plates being disposed one above the other. This is achieved by two pairs of screws 61 and 62 which extend through bracket 57 and plates 59 and 60, and through a pair of wedge-shaped separating members such as member 63. A wedge 64 is interposed between member 63 and bracket 57, and the wedge may be adjusted by means of a screw 65 secured to bracket 57 by a threaded dog 66.

A pair of channel members 67, 68 are respectively supported by bracket 57 and plates 59, 60 by means of screws 69, 70. The channels are shaped to receive the electrical components, such as component 71 and are spaced apart so that the pig-tails 72, 73 of the component can extend outwardly beyond the channels. In this manner, the channels 67, 68 form a magazine for the electrical components which can be fed in the top. The width of the magazine can be adjusted by adjustment of screws 69, 70 and of wedge 64 to have the appropriate value so that the electrical components 71 are freely movable therein. A variety of magazine structures including brackets 56, 57 and plugs 54, 55 may be made up with channels 67, 68 constructed to accommodate different electrical components 71 of different lengths and diameters. The magazine structures may be interchanged by removing pin 57 and lifting each structure bodily out of sockets 52 and 53 and replacing another.

Figures 7, 8:
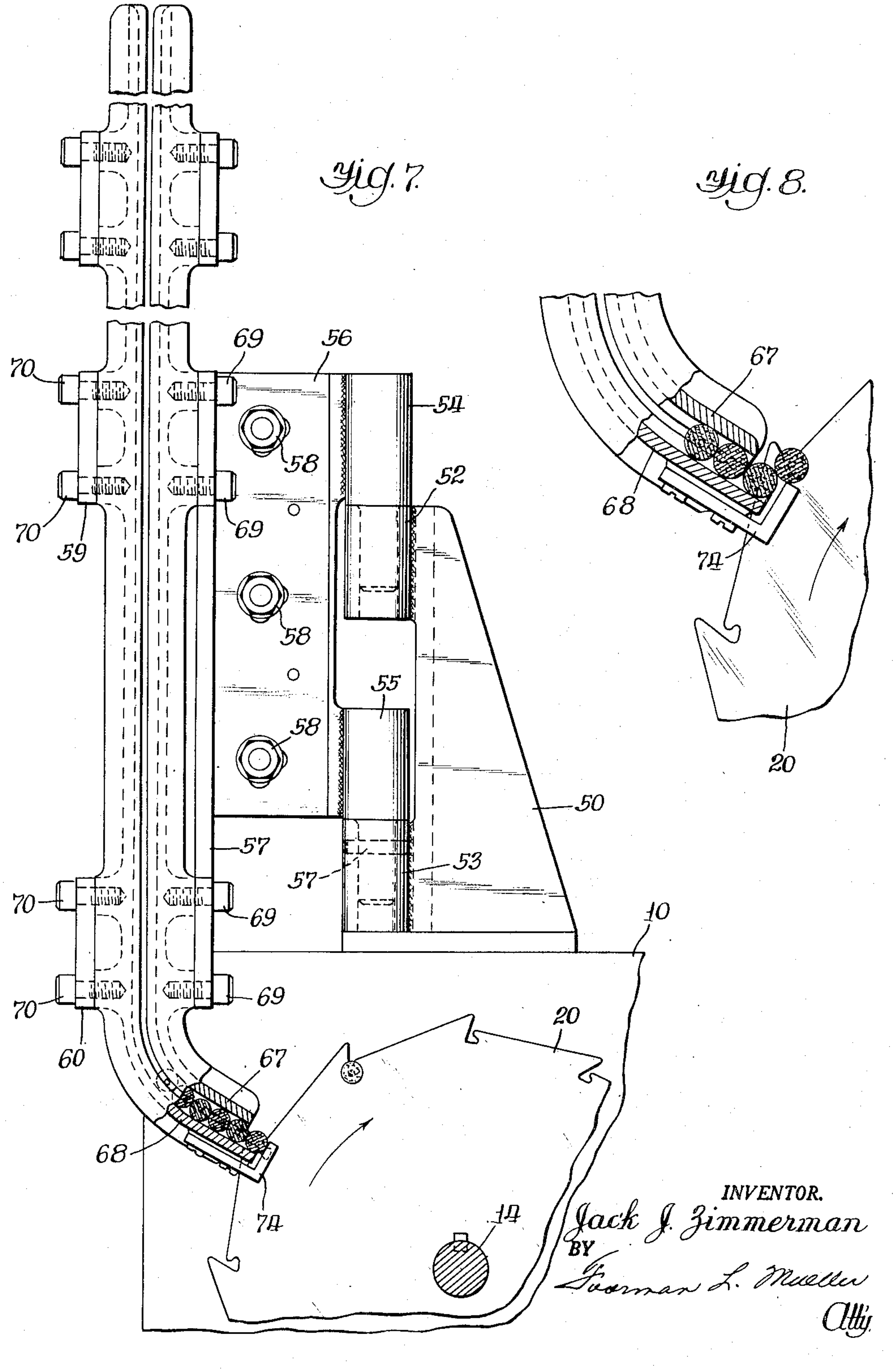
Fig. 7 is a side view, partly in section, of a magazine structure for feeding electrical components whose pig-tails are to be cut and formed into the mechanism of Fig. 1–5.
Fig. 8 is an enlarged view, partly in section, of the magazine.
Figures 9, 10:
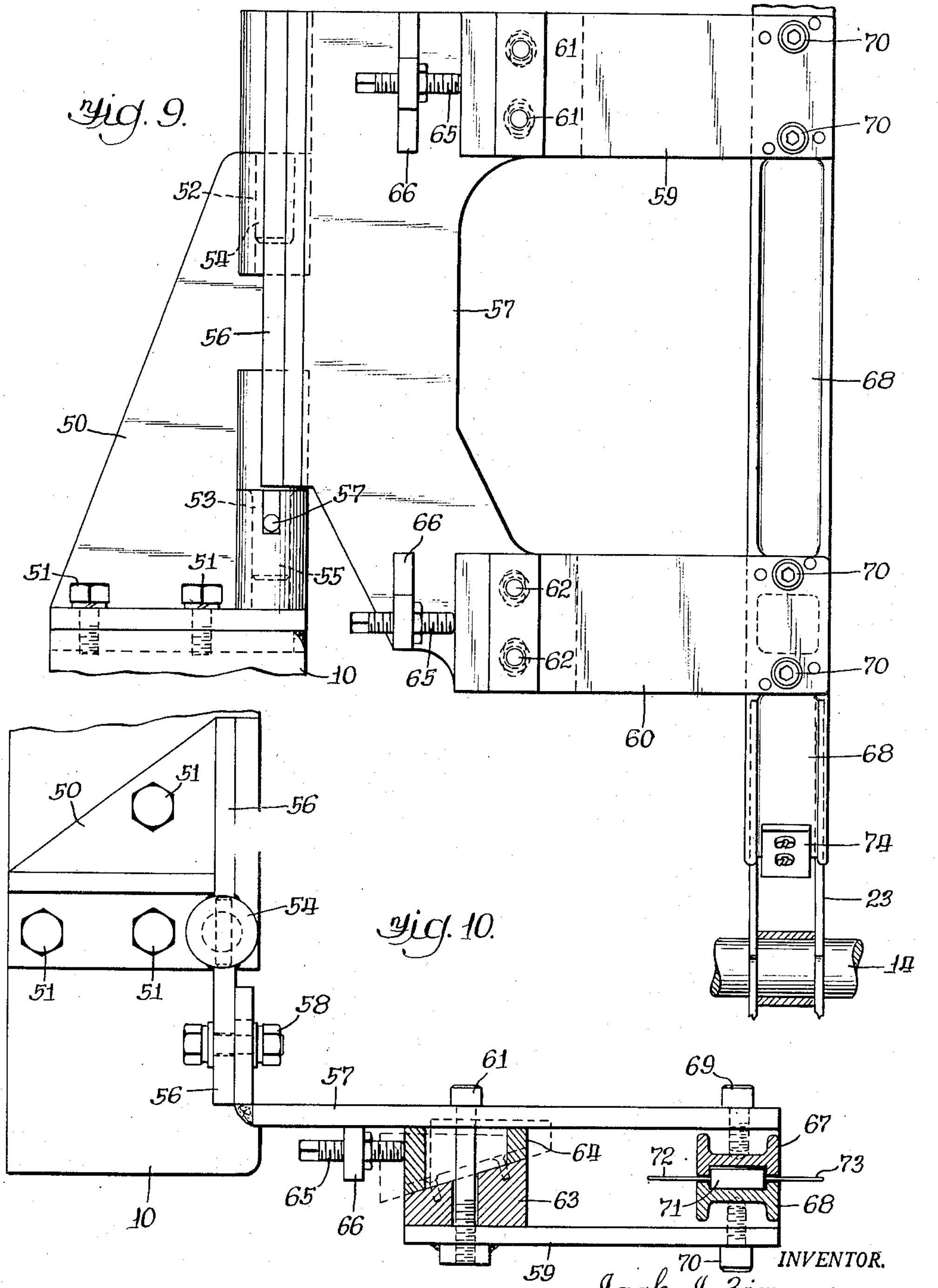
Fig. 9 is a back view of the magazine.
Fig. 10 is a top view, partly in section, of the magazine.

The mouth of the magazine formed by channels 67 and 68 is curved inwardly, as shown in Figs. 7 and 8, and extends slightly into the space between discs 20 and 21. An L-shaped stop member 74 is secured to channel 68 and extends partially across the mouth of the magazine to retain the electrical components within the magazine. As discs 20 and 21 rotate in a clockwise direction, their gullets lift the lowermost electrical component off the stop by means of its protruding pigtails with the component lying across the discs in the position shown in Figs. 2 and 3. This causes the next component in the magazine to drop to the stop 74 and it is lifted away by the next pair of gullets of discs 20, 21. In this manner, the components placed in the magazine are successively placed across the discs 20—23 for the cutting and forming of their pig-tails. Therefore, it is not necessary for an operator continually to place the components across the discs, but they may be placed a carton at a time in the magazine for automatic feeding to the machine.

The invention provides, therefore, an improved mechanism by means of which the contact wires of certain electrical components may be cut and formed to a desired configuration in an extremely rapid and efficient fashion. The use of the mechanism of this application in conjunction with the automatic soldering machine disclosed and claimed in the aforementioned copending application aids materially to the efficient production of radio and television receivers and greatly reduces the manufacturing costs in the production of such apparatus.

While a particular embodiment of the invention has been shown and described, modifications may be made, and it is intended in the appended claims to cover all such modifications as fall within the true spirit and scope of the invention.

I claim:

1. A mechanism for removing the excess length of a pair of contact wires extending from the ends of an electrical component and for forming such wires into a desired configuration, said mechanism including in combination, a rotatable carriage comprising a pair of spaced parallel discs for supporting a series of components of the above mentioned type about their peripheries in two corresponding series of peripheral notches with the contact wires of such components extending axially beyond the sides of said discs and respectively supported in said notches, a pair of flat rectangular shaped forming members each having an upper edge, an inner side and an outer side and disposed in planes parallel to the planes of the sides of said discs with their inner sides adjacent to an arcuate portion of the sides of said discs so that said notches successively pass downwardly past the respective upper edges of said forming members, and each of said forming members having at least a portion of its upper edge tapered inwardly to form a knife edge at the outer side thereof, the contact wires of a component being formed between said forming members and said carriage as said carriage is rotated, a pair of rotary cutting members rotating in the opposite direction to the direction of rotation of the carriage and respectively disposed with their inner sides contiguous to the outer sides of said forming members and each having at least one arm coacting with the respective sides of said notches and in shearing relation with the aforesaid knife edge of said forming members so that portions of the contact wires extending over the outer sides of said forming members are sheared off by said cutting members, and means for rotating said rotary cutting members and said discs in timed relation to one another, first to cut and then to bend the wires of said electrical component.

2. A mechanism for removing the excess length of a pair of contact wires extending from the ends of an electrical component and for forming such wires into a desired configuration, said mechanism including in combination, a rotatable carriage comprising a pair of axially adjustable coaxially spaced parallel discs for supporting a series of components of the above mentioned type about their peripheries in two corresponding series of peripheral notches with the contact wires of such components extending axially beyond the sides of said discs and respectively supported in said notches, a pair of forming members adjustable along an axis parallel to the axis of rotation of said carriage and respectively disposed with their inner sides contiguous to an arcuate portion of the sides of said carriage so that said notches successively pass downwardly past the upper edges of said forming members, a pair of axially adjustable members rotatable about an axis parallel to the axis of rotation of said carriage and rotating in a direction opposite to the direction of rotation of said carriage, said last named pair of members being respectively disposed with their inner sides contiguous to the outer sides of said forming members and each having at least one arm coacting with the respective sides of said notches and in shearing relation with an outer edge of each of said forming members, and means for rotating said discs and said rotatable members in timed relation so that portions of the respective contact wires extending beyond said forming members are sheared off by such arms and the remaining portions of said contact wires are bent over into a desired configuration by said forming members upon subsequent rotation of said carriage.

3. A mechanism for removing the excess length of a pair of contact wires extending from the ends of an electrical component and for forming such wires into a desired configuration, said mechanism including in combination, a rotatable carriage comprising a first pair of coaxial discs spaced apart a distance corresponding to the length of the body portion of electrical components to be supported and each having peripheral supporting gullets, said carriage further comprising a second pair of discs coaxial with said first-mentioned discs respectively spaced from the outer sides of said first-mentioned discs and each having peripheral supporting gullets aligned with the gullets of said first-mentioned discs, a pair of forming members adjustable along an axis parallel to the axis of rotation of said carriage and respectively disposed with their inner sides contiguous to an arcuate portion of the outer sides of said second-mentioned discs so that supporting gullets on said second-mentioned discs successively pass downwardly past the respective upper edges of said forming members, a pair of axially adjustable rotary members rotatable about an axis parallel to the axis of rotation of said carriage and respectively disposed with their inner sides contiguous to the outer sides of said forming members and rotating in a direction opposite to the direction of rotation of said carriage, said rotary members each having at least one arm coacting with the respective sides of said gullet on the respective ones of said second-mentioned discs and in shearing relation with an outer edge of said forming members, and means for rotating said carriage and said rotary members in timed relation so that said contact wires are cut by the shearing action of said rotary members and said forming members and subsequently bent between the inner sides of said forming members and said second-mentioned discs.

4. A mechanism for removing the excess length of a pair of contact wires extending from the ends of an electrical component and for forming such wires into a desired configuration, said mechanism including in combination, a rotatable carriage comprising a pair of axially adjustable coaxially spaced parallel discs for supporting a series of components of the above mentioned type about their peripheries in two corresponding series of peripheral notches with the contact wires of such components extending axially beyond the sides of said discs and respectively supported in said notches, a pair of forming members adjustable along an axis parallel to the axis of rotation of said carriage and respectively disposed with their inner sides contiguous to an arcuate portion of the sides of said carriage so that said notches successively pass downwardly past the upper edges of said forming members, a pair of axially adjustable members rotatable about an axis parallel to the axis of rotation of said carriage and rotating in a direction opposite to the direction of rotation of said carriage, said last named pair of members being respectively disposed with their inner sides contiguous to the outer sides of said forming members and each having at least one arm coacting with the respective sides of said notches and in shearing relation with an outer edge of each of said forming members, means for rotating said discs and said rotatable members in timed relation so that portions of the respective contact wires extending beyond said forming members are sheared off by such arms and the remaining portions of said contact wires are bent over into a desired configuration by said forming members upon subsequent rotation of said carriage, and a pair of ejector members rotatable about an axis parallel to the axis of rotation of said carriage and positioned between said discs to engage an electrical component supported thereon at a point in the rotation of said carriage subsequent to the cutting and forming of the wires of said component.

5. A mechanism for removing the excess length of a pair of contact wires extending from the ends of an electrical component and for forming such wires into a desired configuration, said mechanism including in combination, a rotatable carriage comprising a first pair of coaxial discs spaced apart a distance corresponding to the length of the body portion of electrical components to be supported and each having peripheral supporting gullets, said carriage further comprising a second pair of discs coaxial with said first-mentioned discs respectively spaced from the outer sides of said first-mentioned discs and each having peripheral supporting gullets aligned with the gullets of said first-mentioned discs, a pair of forming members adjustable along an axis parallel to the axis of rotation of said carriage and respectively disposed with their inner sides contiguous to an arcuate portion of the outer sides of said second-mentioned discs so that said gullets on said second mentioned discs successively pass downwardly past the respective upper edges of said forming members, a pair of axially adjustable rotary members rotatable about an axis parallel to the axis of rotation of said carriage and respectively disposed with their inner sides contiguous to the outer sides of said forming members and rotating in a direction opposite to the direction of rotation of said carriage, said rotary members each having at least one arm coacting with the respective sides of said gullets in the respective ones of said second mentioned discs and in shearing relation with an outer edge of said forming members, means for rotating said carriage and said rotary members in timed relation so that said contact wires are cut by the shearing action of said rotary members and said forming members and subsequently bent between the inner sides of said forming members and said second-mentioned discs, and a pair of ejector members rotatable about an axis parallel to the axis of rotation of said carriage and positioned between said discs to engage an electrical component supported thereon at a point in the rotation of said carriage subsequent to the cutting and forming of the wires of said component.

References Cited in the file of this patent

UNITED STATES PATENTS

| | | |
|---|---|---|
| 666,905 | Packer | Jan. 29, 1901 |
| 861,858 | Johnson | July 30, 1907 |
| 1,052,092 | Robertson | Feb. 4, 1913 |
| 1,478,683 | Stevens | Dec. 25, 1923 |
| 1,616,453 | Knable | Feb. 8, 1927 |
| 2,236,150 | Maltby | Mar. 25, 1941 |
| 2,321,735 | Clifford | June 15, 1943 |
| 2,406,456 | Dewitt | Aug. 27, 1946 |
| 2,450,920 | Shand | Oct. 12, 1948 |
| 2,555,893 | Lebrun | June 5, 1951 |
| 2,592,019 | Farnett | Apr. 8, 1952 |
| 2,634,576 | Seibel | Apr. 14, 1953 |
| 2,679,723 | Marano | June 1, 1954 |